(12) United States Patent
Kim et al.

(10) Patent No.: US 6,270,572 B1
(45) Date of Patent: Aug. 7, 2001

(54) METHOD FOR MANUFACTURING THIN FILM USING ATOMIC LAYER DEPOSITION

(75) Inventors: Yeong-kwan Kim, Seongnam; Sang-in Lee; Chang-soo Park, both of Suwon; Sang-min Lee, Seoul, all of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/371,709

(22) Filed: Aug. 9, 1999

(30) Foreign Application Priority Data

Aug. 7, 1998 (KR) .................................................. 98-32139

(51) Int. Cl.$^7$ .................................................. C30B 25/02
(52) U.S. Cl. .................................. 117/93; 117/89; 117/102
(58) Field of Search .................................. 117/102, 89, 93

(56) References Cited

U.S. PATENT DOCUMENTS 5,851,849 * 12/1998 Comizzoli et al. ..................... 438/38

* cited by examiner

*Primary Examiner*—Shrive Beck
*Assistant Examiner*—Michael Cleveland
(74) *Attorney, Agent, or Firm*—Marger Johnson & McCollom, P.C.

(57) ABSTRACT

A thin film manufacturing method is provided. The method includes the step of chemically adsorbing a first reactant on a substrate by injecting the first reactant into a chamber in which the substrate is loaded. Physisorbed first reactant on the chemically adsorbed first reactant is removed by purging or pumping the chamber. After the first reactant is densely chemically adsorbed on the substrate by re-injecting the first reactant into the chamber, the physisorbed first reactant on the dense chemisorbed first reactant is removed by purging or pumping the chamber. A second reactant is chemically adsorbed onto the surface of the substrate by injecting the second reactant into the chamber. Physisorbed second reactant on the chemisorbed first reactant and the second reactant is removed by purging or pumping the chamber. A solid thin film is formed by chemical exchange through densely adsorbing the second reactant onto the substrate by re-injecting the second reactant into the chamber. According to the present invention, it is possible to obtain a precise stoichiometric thin film having a high film density, since the first reactant and the second reactant are densely adsorbed and the impurities are substantially removed by pumping or purging

14 Claims, 7 Drawing Sheets

METHOD FOR MANUFACTURING THIN FILM USING ATOMIC LAYER DEPOSITION

BACKGROUND OF THE INVENTION

1. Field of the Invention

The present invention relates to a method for manufacturing a thin film, and more particularly, to a method for manufacturing a thin film by atomic layer deposition (ALD).

2. Description of the Related Art

A thin film is typically used for a dielectric of a semiconductor device, a transparent conductor of a liquid-crystal display, or a protective layer of an electroluminescent thin film display. The thin film is formed through evaporation, chemical vapor deposition or ALD.

ALD is a surface controlled process, and uses two dimensional layer by layer deposition. In the ALD method, the deposition is performed in a surface kinetic regime. Thus, the step coverage is excellent. Also, a reactant is decomposed through chemical exchange by periodically supplying the reactant without pyrolysis so that the resultant film has high density and precise stoichiometry. Also, by-products generated by the chemical exchange are gasses that can be easily removed. Accordingly, so a chamber can be easily cleaned. The temperature is the only process variable in the ALD method, so the process is easily controlled and maintained.

However, in the conventional ALD, since enough reactant is not adsorbed on the surface of a substrate, a defect such as a pinhole is generated in the thin film. Therefore, the physical characteristics of the thin film, such as the film density, deteriorate. Also, in the conventional ALD, since a chemical ligand is not substantially removed, it is not possible to obtain a precise stoichiometric thin film.

SUMMARY OF THE INVENTION

To solve the above problems, the present invention provides a method for manufacturing a precise stoichiometric thin film having a high film density by atomic layer deposition.

Accordingly, the method includes the step of chemically adsorbing a first reactant onto a substrate by injecting the first reactant into a chamber which the substrate is loaded. A physisorbed first reactant on the chemically adsorbed first reactant is removed by purging or pumping the chamber. After the first reactant is densely chemically adsorbed onto the substrate by injecting the first reactant into the chamber, the physisorbed first reactant on the dense chemisorbed first reactant is removed by purging or pumping the chamber. A second reactant is chemically adsorbed onto the surface of the substrate by injecting the second reactant into the chamber. A physisorbed second reactant on densely chemisorbed first reactant and the second reactant is removed by purging or pumping the chamber. A solid thin film is formed by chemical exchange through densely adsorbed second reactant on the substrate by re-injecting the second reactant into the chamber.

After densely adsorbing the second reactant, the physically adsorbed second reactant and residuals generated during the chemical exchange can be removed by purging or pumping the chamber. The processes of injecting the second reactant and removing the physically adsorbed second reactant and the residuals can be sequentially repeated two or more times. The processes of injecting the first reactant and removing the physically adsorbed first reactant can be sequentially repeated two or more times. The substrate is (100) silicon substrate. The first reactant and the second reactant are comprised of an atom and a chemical ligand for constructing the solid thin film.

The solid thin film is comprised of a material selected from the group consisting of a single element, an oxide of a single element, a composite oxide, a nitride of a single element, and a composite nitride. The single element is selected from the group consisting of Mo, Al, Cu, Ti, Ta, Pt, Ru, Rh, Ir, W, and Ag. The oxide of a single element is selected from the group consisting of $Al_2O_3$, $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$. The composite oxide is selected from the group consisting of $SrTiO_3$, $PbTiO_3$, $SrRuO_3$, $CaRuO_3$, $(Ba,Sr)TiO_3$, $Pb(Zr,Ti)O_3$, $(Pb,La)(Zr,Ti)O_3$, $(Sr,Ca)RuO_3$, $In_2O_3$ doped with Sn, $In_2O_3$ doped with Fe, and $In_2O_3$ doped with Zr. The nitride of a single element is one selected from the group consisting of SiN, NbN, ZrN, TaN, $Ya_3N_5$, AlN, GaN, WN, and BN. The composite nitride is one selected from the group consisting of WBN, WSiN, TiSiN, TaSiN, AlSiN, and AlTiN.

According to the present invention, it is possible to obtain a precise stoichiometric thin film having a high film density, since the first reactant and the second reactant are densely adsorbed and the impurities are substantially removed by pumping or purging.

BRIEF DESCRIPTION OF THE DRAWINGS

The above objective and advantages of the present invention will become more apparent by describing in detail a preferred embodiment thereof with reference to the attached drawings in which.

DESCRIPTION OF THE PREFERRED EMBODIMENTS

Figure 1:
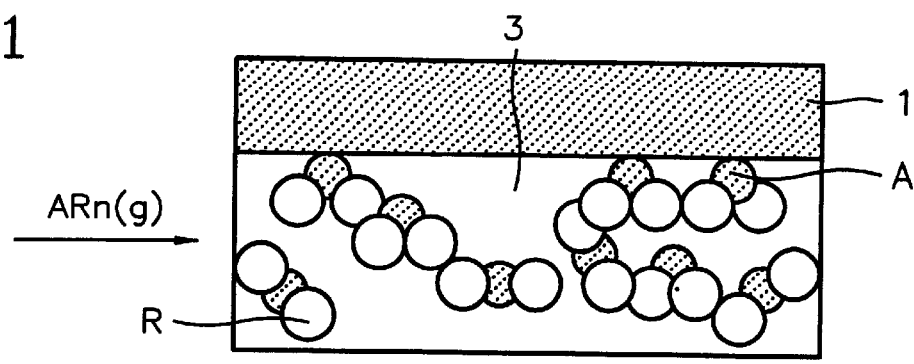
FIGS. 1, 2, 3, 4, 5, 6, 7 and 8 describe processes of manufacturing a thin film using an atomic layer deposition according to the present invention.

FIGS. 1 through 8 show process steps of manufacturing a thin film using atomic layer deposition according to the present invention. In FIGS. 1 thirough 8, when the thin film to be deposited is formed of a two component compound comprised of A and B, a first reactant and a second reactant are respectively called ARn(g) and BPn(g). Here, Rn is a chemical ligand formed of n R radicals. Pn is a chemical ligand fonned of n P radicals. g denotes a gas state.

Referring to FIG. 1, the first reactant is chemically adsorbed (chemisorption) and physically adsorbed (physisorption) onto the surface of a substrate 1, for example, a (100) silicon substrate, by injecting the first reactant ARn(g) into a chamber (not shown) into which the substrate 1 is loaded. The chemisorption and physisorption can occur simultaneously at the substrate surface. The first reactant is also physically adsorbed onto the chemisorbed first reactant (physisorption). The chemisorption occurs most at the substrate surface while the physisorption occurs primarily on the chemisorbed first reactant. The chemisorbed first reactant is strongly bonded to the substrate, but the physisorbed first reactant can be easily removed by pumping or purging.

The physically adsorbed first reactant blocks some chemisorption sites on the substrate, preventing further chemisorption at these sites. Accordingly, an empty space 3 is formed on the substrate.

Figure 2:
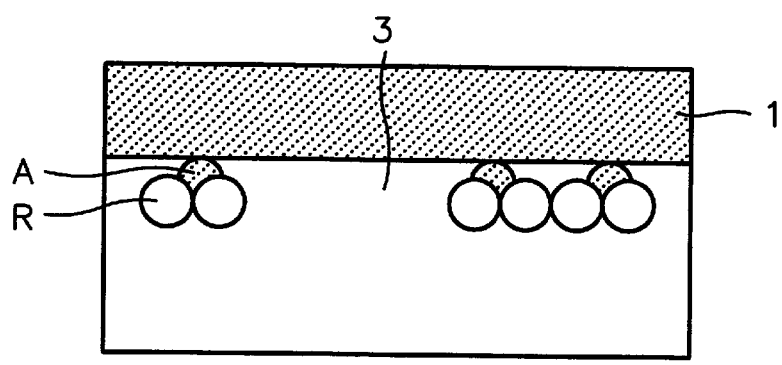

Referring to FIG. 2, the physisorbed first reactant is substantially removed by purging or pumping the chamber in which the chemisorbed and physisorbed first reactant is formed. By doing so, the chemisorbed first reactant remains on the surface of the substrate 1. The chemisorbed first reactant is ARn(s) of solid state, and previously unfilled chemisorption sites are exposed. Here, s denotes a solid state.

Figure 3:
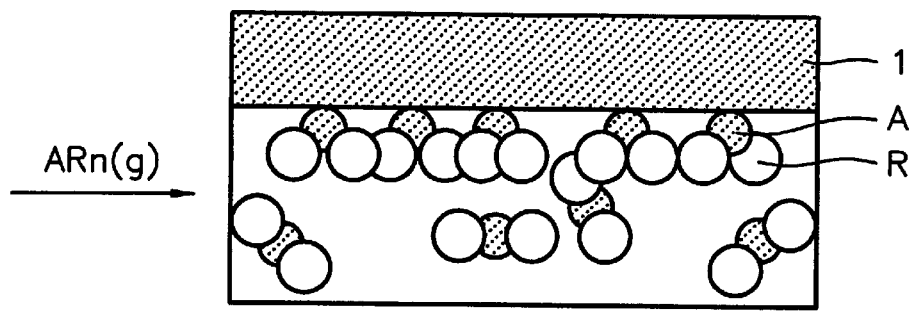

Referring to FIG. 3, the first reactant is densely chemisorbed onto the surface of the substrate 1 by re-injecting the first reactant ARn(g) into the chamber including the substrate 1 on which the solid ARn(s) is formed. By doing so, the first reactant is chemisorbed and physisorbed onto the empty space 3 shown in FIG. 1. Like in FIG. 1, the first reactant is chemisorbed onto the surface of the substrate 1. The physisorbed first reactant is also formed on the chemisorbed first reactant.

Figure 4:
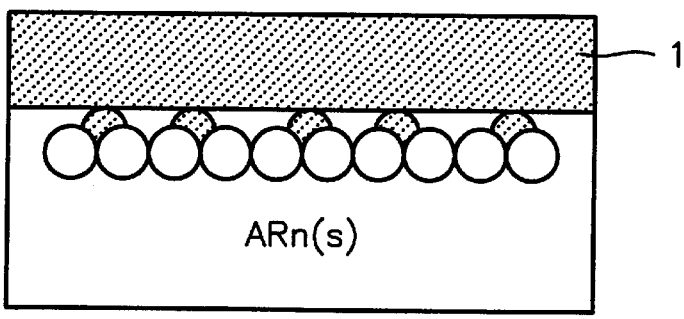

Referring to FIG. 4, the physisorbed first reactant is substantially removed by pumping or purging the chamber including the substrate 1 on which the chemisorbed first reactant is formed. The process of injecting the first reactant and removing the physisorbed first reactant is performed twice, so only the densely chemisorbed first reactant, i.e., the solid ARn(s), remains on the surface of the substrate 1 and impurities such as a chemical ligand are substantially removed. Here, s denotes a solid state. In the present embodiment, the processes shown in FIGS. 1 through 4 can be repeated more than two times. Also, the process steps shown in FIGS. 3 and 4 can be sequentially repeated one or more times.

Figure 5:
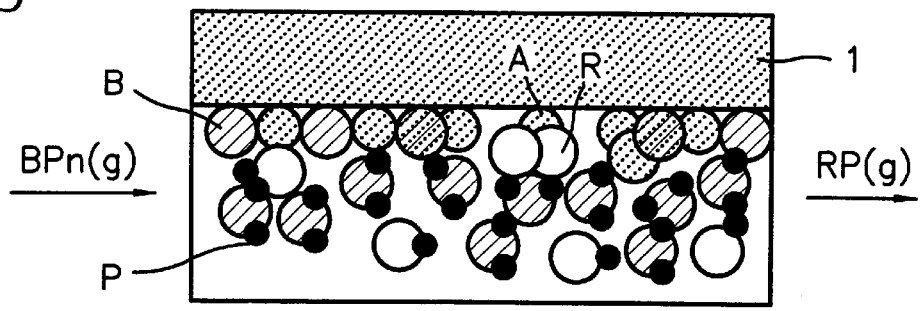

Referring to FIG. 5, a second reactant BPn(g) is injected into the chamber including the substrate 1 on which the densely chemisorbed first reactant is formed, and is chemically adsorbed (chemisorbed) and physically adsorbed (physisorbed) to the substrate surface. The second reactant is also physically adsorbed onto the chemisorbed second reactant. By doing so, the chemisorbed first and second reactant react to form an atomic monolayer formed of A and B by chemical exchange. Since the second reactant is not densely chemisorbed onto the substrate surface, the monolayer is also not dense at this time. Here, Rn and Pn, which are chemical ligands, are removed in a high vapor pressure state. Since the second reactant of FIG. 5 is not densely chemisorbed onto the surface of the substrate like the first reactant of FIG. 1, the second reactant is inadequately chemically exchanged with the first reactant. Thus, impurities are generated in the monolayer, or a stoichiometric composition ratio is not met.

Figure 6:
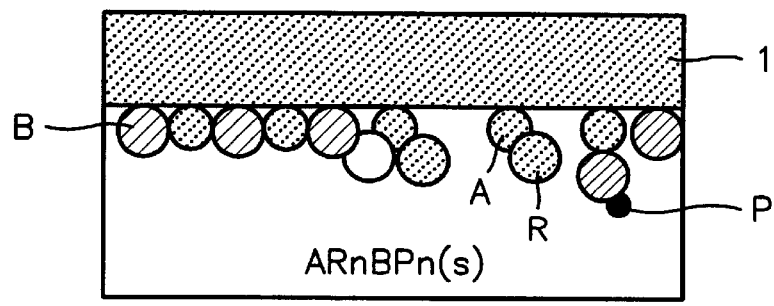

Referring to FIG. 6, the physisorbed second reactant is removed by pumping or purging the chamber in which the monolayer which is not dense and the physisorbed second reactant are formed. By doing so, a solid monolayer which is chemisorbed is formed on the surface of the substrate. Since the solid monolayer of FIG. 6 is ARnBPn(s), impurities of is 5 RnPn(s) remain, the stoichiometric composition ratio is not met, and the film density is poor. Here, s denotes a solid state.

Figure 7:
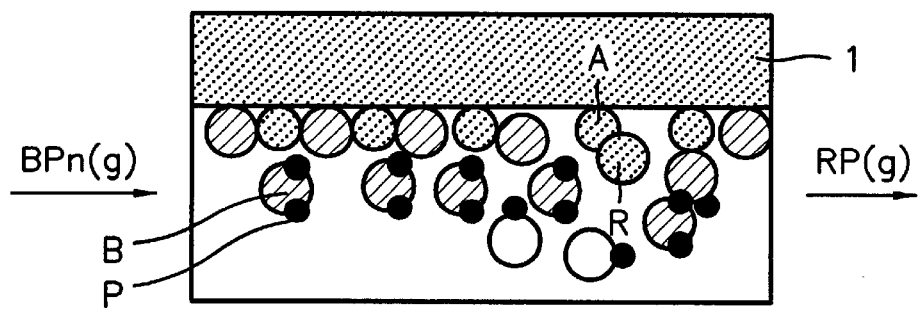

Referring to FIG. 7, in order to improve the above-mentioned stoichiometric composition ratio and the film density, the second reactant is chemically and physically adsorbed onto the surface of the substrate by re-injecting the second reactant BPn(g) into the chamber including the substrate. The second reactant is also physically adsorbed onto the chemisorbed first reactant. The densely chemisorbed first reactant reacts with the densely chemisorbed second reactant, thereby forming a dense monolayer formed of the A and B atoms by chemical exchange. The dense monolayer has a thickness of the atomic layer. At this time, Rn and Pn, which are chemical ligands, are removed in a gas state having a high vapor pressure.

Since the second reactant of FIG. 7 is chemically adsorbed onto the surface of the substrate which is not densely chemisorbed in FIG. 5, the second reactant is sufficiently chemically exchanged with the dense first reactant, thus reducing the impurities in the single layer and meeting the stoichiometric composition ratio.

Figure 8:
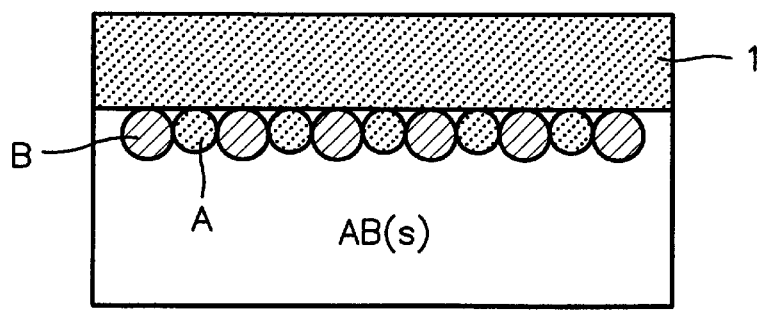

Referring to FIG. 8, the physisorbed second reactant is substantially removed by purging or pumping the chamber in which the dense monolayer and the physisorbed second reactant are formed. By doing so, only the solid dense monolayer which is densely and chemically adsorbed, i.e., AB(s), remains on the surface of the substrate. Here, s denotes a solid state. In the present embodiment, the processes of FIGS. 5 through 8 can be repeated more than two times. Also, the process steps shown in FIGS. 7 and 8 can be sequentially repeated one or more times.

Figure 9A:
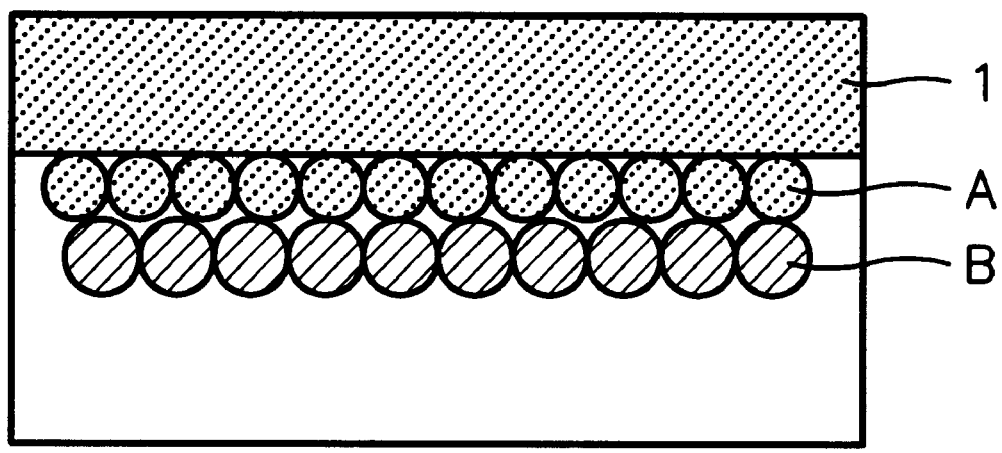
FIGS. 9A and 9B show examples in which the thin film is manufactured using atomic layer deposition in different ways from that of the thin film of FIG. 8.
Figure 9B:
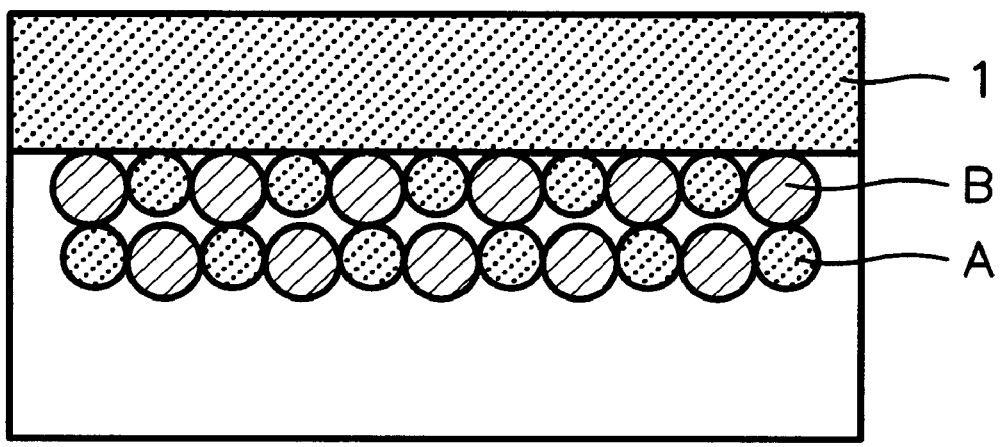

In FIG. 8, A and B are formed on the surface of the substrate, thus forming a compound, AB(s). However, when the atomic layer deposition according to the present invention is performed, A may be formed on the surface of the substrate and B may be formed on A, thus forming the compound AB(s) as shown in FIG. 9A, or A and B may be formed on the surface of the substrate and B and A formed on A and B, thus forming the compound AB(s) as shown in FIG. 9B.

Here, processes of forming a thin film using the thin film manufacturing method according to the present invention will be described.

Figure 10:
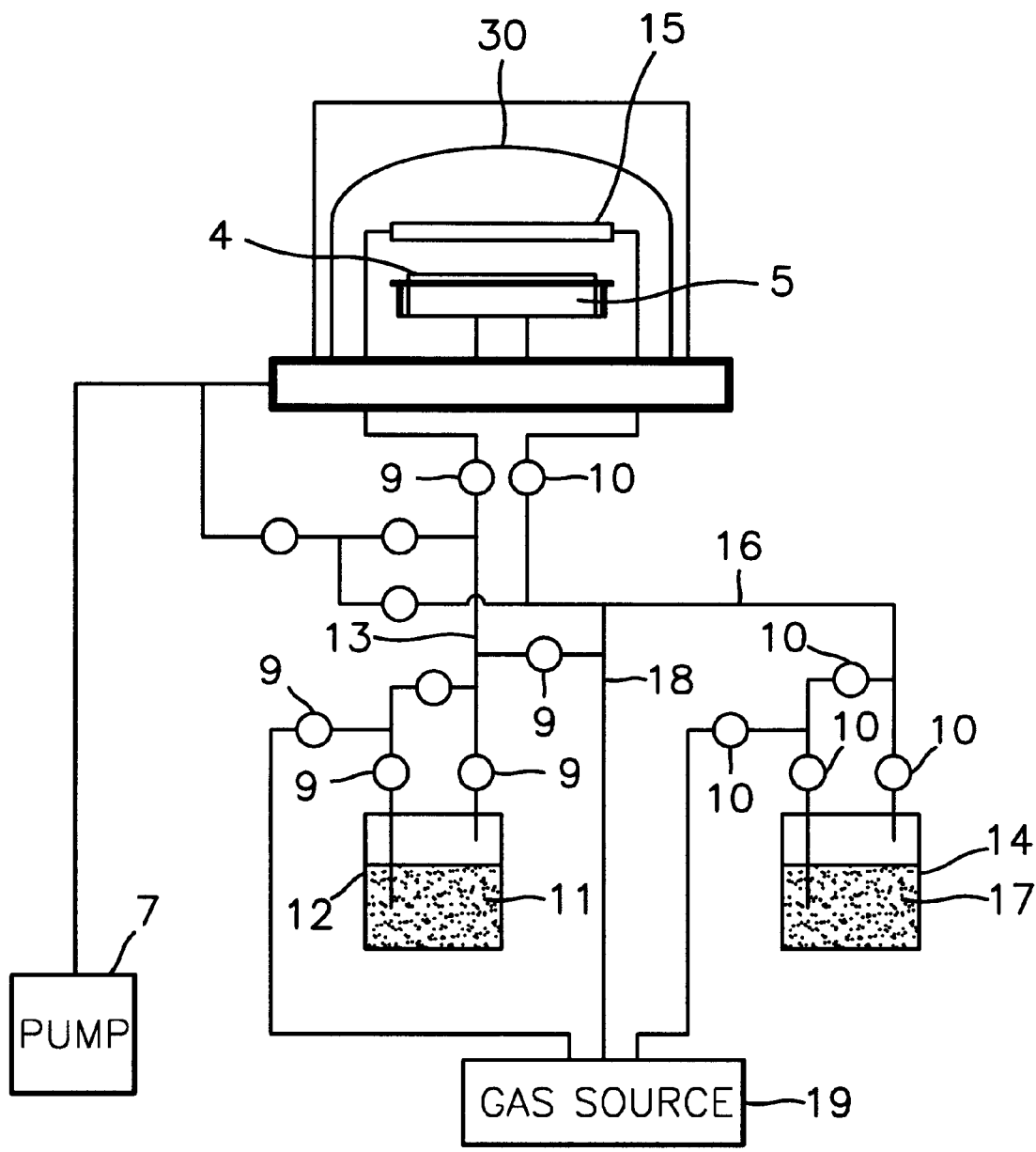
FIG. 10 is a schematic diagram of a thin film manufacturing apparatus used for a thin film manufacturing method according to the present invention.
Figure 11:
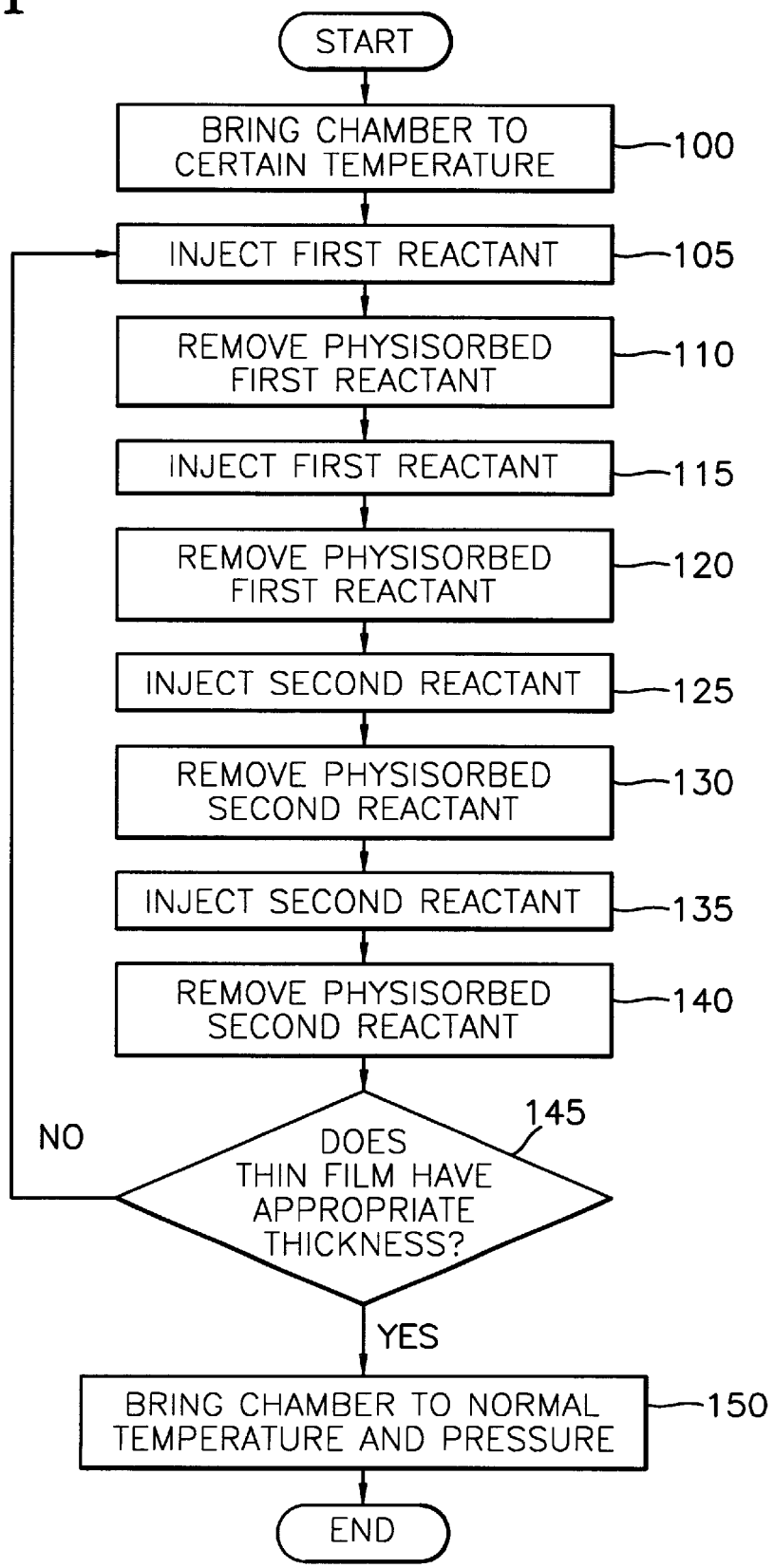
FIG. 11 is a flowchart describing the thin film manufacturing method according to the present invention.

FIG. 10 is a schematic diagram of a thin film manufacturing apparatus used for the thin film manufacturing method according to the present invention. FIG. 11 is a flowchart describing the thin film manufacturing method according to the present invention.

After loading a substrate 4, for example, a (100) silicon substrate into a chamber 30, the substrate is brought to a temperature of about 150° C. to 375° C., preferably 300° C., using a heater 5 (step 100). At this time, the temperature of the heater 5 is maintained at about 450° C. in order to maintain the temperature of the substrate at 300° C.

A first reactant 11 such as $Al(CH_3)_3$ (TMA) in a first bubbler 12 is injected into the chamber 30 for 0.1 through 10 seconds, preferably, 0.5 second, while the chamber 30 is maintained at 150° C. to 375° C. (step 105).

Here, the first reactant 11 is injected using a bubbling method. The first reactant 11 is injected through a first gas line 13 and a shower head 15 by selectively operating a valve 9, after changing the first reactant 11 from a liquid state into a gas by injecting 100 sccm of Ar carrier gas from a gas source 19 into the first bubbler 12 maintained at a temperature of 20through 22° C. 400 sccm of nitrogen gas from the gas source 19 is injected through a second gas line 18 and the shower head 15 in order to improve the flow velocity of the first reactant 11 and dilute the first reactant 11 during the injection of the first reactant 11 . As a result, 500 sccm of gas provided to the chamber 30 during the injection of the first reactant 11. At this time, the pressure of the chamber is maintained at 1 to 2 Torr. By doing so, the first reactant 11 is chemisorbed onto the surface of the substrate 4 to atomic level. The physisorbed first reactant 11 is formed on the chemisorbed first reactant 11.

The physisorbed first reactant is removed by selectively operating the valve 9 to the chamber 1 while maintaining the temperature at 150 to 375° C. and the pressure at 1 to 2 Torr, and purging the 400 sccm of nitrogen gas of the gas source 19 for 0.1 through 10 seconds, preferably, 1 second, using the first gas line 13 or the second gas line 18 (step 110). In the present embodiment, the physisorbed first reactant is removed by purging. However, the physically adsorbed first reactant can be removed by pumping the chamber to a vacuum state without purging using a pump 7 shown in FIG. 10.

The first reactant 11 is again injected into the chamber 30 from which the physisorbed first reactant was removed, like in the step 105 (step 115). At this time, the time spent injecting the first reactant in the step 115 is equal to or shorter than that spent injecting the first reactant in the step 105. The physisorbed first reactant is removed from the chamber 30, like in the step 110 (step 120). At this time, the time spent removing the physically adsorbed first reactant in the step 120 is equal to or shorter than that spent removing the first reactant in the step 110. When the injection of the first reactant and the first purge process are repeatedly performed, the densely chemisorbed first reactant is formed on the substrate. In the present embodiment, the processes of injecting the first reactant and removing the physisorbed first reactant are each performed two times. However, the processes can be performed more times.

A second reactant 17 such as deionized water in a second bubbler 14 is injected into the chamber including the substrate on which the dense chemisorbed first reactant is formed, through the gas line 16 and the shower head 15 for millisecond to 10 seconds, preferably 0.5 seconds, by selectively operating a valve 10 while a temperature of 150 to 375° C. and a pressure of 1 to 2 Torr are maintained (step 125).

Here, the second reactant 17 is injected using the bubbling method, like the first reactant. Namely, the second reactant is injected through a third gas line 16 and the shower head 15 after changing the second reactant 17 from a liquid state to a gas state by injecting 100 sccm of Ar carrier gas of the gas source 19 into the second bubbler 14 maintained at a temperature of 20 to 22° C. The 400 sccm of nitrogen gas is injected through the second gas line 18 and the shower head 15 in order to improve the flow velocity of the second reactant 17 and to dilute the second reactant 17 during injection of the second reactant 17. As a result, the amount of gas provided to the chamber 30 during the injection of the second reactant 17 is 500 sccm. At this time, the pressure of the chamber 30 is maintained at 1 to 2 Torr. By doing so, the second reactant is chemisorbed onto the substrate 4 on which the densely chemisorbed first reactant is formed. The second reactant is physisorbed into the chemisorbed first and second reactants. An aluminum oxide film which is not dense in levels of an atomic layer is formed from the densely chemisorbed first reactant and the chemisorbed second reactant which is not dense, by the chemical exchange method.

The physisorbed second reactant is removed by selectively operating the valve 10 to the chamber 1 in which the aluminum oxide film which is not dense in the levels of the atomic layer is formed, and by purging with nitrogen gas (400 sccm) from of the gas source 19 for 0.1 to 10 seconds, preferably 1 second, using the second gas line 18 or the third gas line 16, while a temperature of 150 to 375° C. and a pressure of 1 to 2 Torr are maintained (step 130). In the present embodiment, the physisorbed second reactant is removed by purging. However, the physisorbed second reactant can be removed by pumping the chamber to a vacuum state without purging.

The second reactant 11 is again injected into the chamber 30 from which of the physisorbed second reactant has been removed, like in the step 125 (step 135). At this time, the time spent injecting the second reactant in the step 135 is equal to or shorter than that spent injecting the second reactant in the step 125. The physisorbed second reactant is removed from the chamber 30 like in the step 130 (step 140). When the processes of injecting the second reactant and removing the physisorbed second reactant are repeatedly performed, the densely chemisorbed second reactant on the substrate is formed. As a result, the dense chemisorbed first reactant and the dense chemisorbed second reactant form a dense aluminum oxide film in levels of the atomic layer by chemical exchange. In the present embodiment, the processes of injecting the second reactant and removing the physisorbed second reactant are each performed two times. However, the processes can be performed more than two times.

Then, it is checked whether a thin film having a thickness of about 10 to 1,000 Å is formed by periodically and repeatedly performing steps 105 through 140 (step 145). When the thin film has an appropriate thickness, the thin film manufacturing processes are completed by returning the temperature and the pressure of the chamber to normal and not repeating the above cycle (step 150).

In FIG. 11, the first and second reactants form the aluminum oxide film $Al_2O_3$ using $Al(CH_3)_3$ (TMA) and the deionized water. A TiN film can be formed if the first and second reactants are $TiCl_4$ and $NH_3$. An Mo film can be formed if the first and second reactants are $MoCl_5$, and $H_2$, respectively.

Furthermore, according to the thin film manufacturing method according to the present invention, a solid thin film of a single element, an oxide of a single element, a composite oxide, a nitride of a single element, or a composite nitride can be fonned instead of the aluminum oxide film, the TiN film, and the Mo film. Al, Cu, Ti, Ta, Pt, Ru, Rh, Ir, W, and Ag can be used as the solid thin film of the single element. $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$ can be used as the oxide of a single element. $SrTiO_3$, $PbTiO_3$, $SrRuO_3$, $CaRuO_3$, $(Ba,Sr)TiO_3$, $Pb(Zr,Ti)O_3$, $(Pb.La)(Zr,Ti)O_3$, $(Sr,Ca) RuO_3$, $In_2O_3$ doped with Sn, $In_2O_3$ doped with Fe, and $In_2O_3$ doped with Zr can be used as the composite oxide film. Also, SiN, NbN, ZrN, TaN, $Ya_3N_5$, AlN, GaN, WN, and BN can be used as the nitride of a single atom. WBN, WSiN, TiSiN, TaSiN, AlSiN, and AlTiN can be used as the composite nitride.

As mentioned above, in the thin film manufacturing method according to the present invention, after repeatedly injecting the first reactant and removing the physisorbed first reactant while the temperature and the pressure are uniformly maintained, the second reactant is repeatedly injected and the physisorbed second reactant is repeatedly removed. By doing so, it is possible to obtain a precise stoichiometric thin film having a high film density, since the first reactant reacts with the densely deposited second reactant by chemical exchange, while the first reactant is densely deposited on the substrate.

Figure 12:
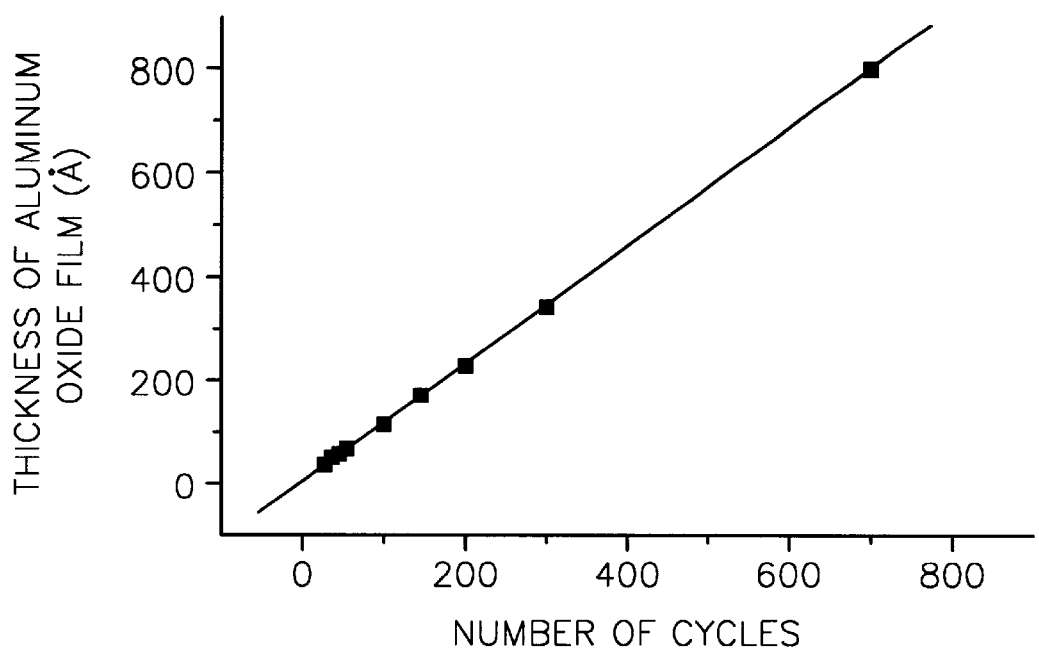
FIG. 12 is a graph showing the thickness of an aluminum oxide film per cycle manufactured by the thin film manufacturing method according to the present invention.

FIG. 12 is a graph showing the thickness of the aluminum oxide film per cycle manufactured by the thin film manufacturing method according to the present invention.

The X axis denotes the number of cycles. Here, one cycle includes the steps of injecting the first reactant, removing the physisorbed first reactant, injecting the first reactant, removing the physisorbed first reactant, injecting the second reactant, removing the hysisorbed second reactant, injecting the second reactant, and removing the physisorbed second reactant. The Y axis denotes the thickness of the aluminum oxide film. As shown in FIG. 12, according to the thin film manufacturing method according to the present invention, the aluminum is grown at a thickness of about 1.1A per cycle. This is similar to a theoretical value.

Figure 13:
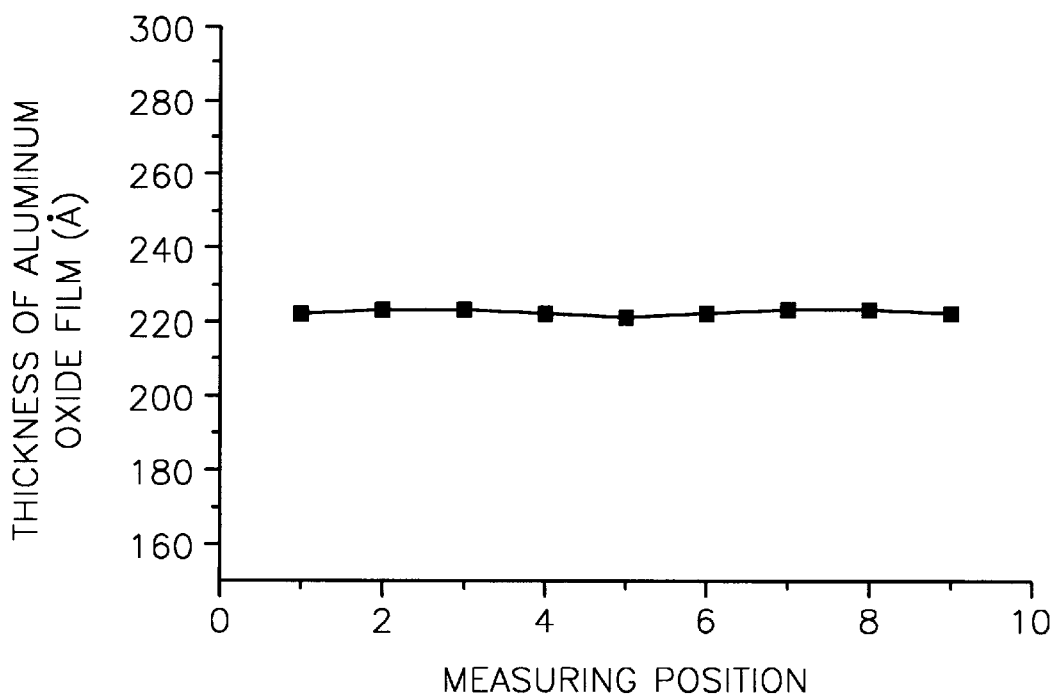
FIG. 13 is a graph showing uniformity in an aluminum oxide film manufactured by the thin film manufacturing method according to the present invention.

FIG. 13 is a graph showing the uniformity of the substrate of the aluminum oxide film manufactured by the thin film manufacturing method according to the present invention.

The X axis denotes the position at which the film thiclkess on an 8 inch substrate was measured. The measurement positions were the center, four points spaced at 90° intervals around a circle concentric with the wafer's center and having a 3.5 inch radius, and four points spaced at 90' intervals around a circle concentric with the wafer's center and having a 1.75 inch radius. The Y axis denotes the thiclkess of the aluminum oxide film. As shown in FIG. 12, the uniformity is excellent over the 8 inch substrate.

Figure 14:
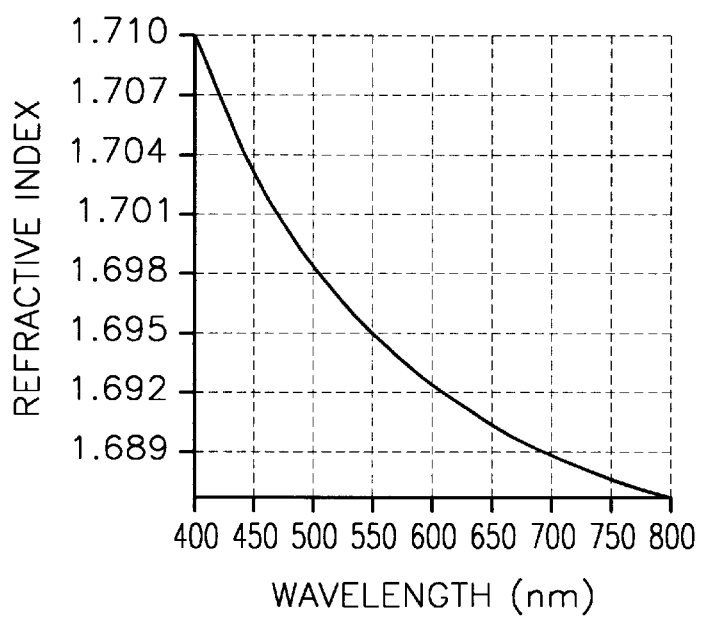
FIGS. 14 and 15 are graphs showing refractive index for wavelength of aluminum oxide films manufactured according to the present invention and a conventional method, respectively.
Figure 15:
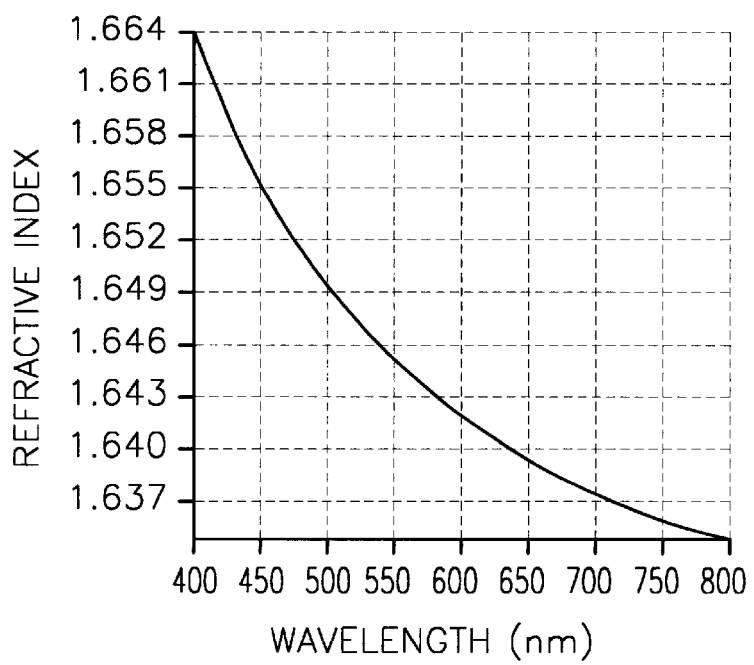

FIGS. 14 and 15 are graphs showing refractive index according to wavelength of the aluminum oxide film manufactured by the present invention and a conventional method, respectively. The X axis denotes the wavelength of 400 through 800 nm. The Y axis denotes the refractive index.

The refractive index of the aluminum oxide film manufactured by the present invention is 1.67 to 1.73 in the range of 400 to 800 nm. In particular, as shown in FIGS. 14 and 15, at the wavelength of 500 nm, the refractive index of the aluminum oxide manufactured by the present invention is 1.698, which is larger than the refractive index 1.649 of the aluminum oxide manufactured by a conventional method. Accordingly, it is noted that the film density is high. Also, the refractive index of the aluminum oxide film manufactured by the present invention is similar to that measured after annealing the aluminum oxide film manufactured by the conventional method at 850° C. for 30 minutes. Therefore, the aluminum oxide film according to the present invention need not be annealed.

As mentioned above, according to the thin film manufacturing method according to the present invention, it is possible to obtain a thin film having excellent step coverage and uniformity since the atomic layer deposition is used. Also, according to the thin film manufacturing method according to the present invention, it is possible to densely and chemically adsorb the reactant onto the substrate by repeatedly performing the process of substantially removing the impurities by performing the purging and the pumping after injecting the reactants while the temperature and the pressure are uniformly maintained. By doing so, it is possible to obtain a precise stoichiometric thin film having a high density.

The present invention is not restricted to the above embodiment, and it is clearly understood that many variations are possible within the scope and spirit of the present invention by one skilled in the art.

What is claimed is:

1. A thin film manufacturing method comprising:
   (a) initially injecting a first reactant into a chamber in which a substrate with chemisorption sites on its surface is loaded, thereby chemically adsorbing a first portion of the first reactant onto the surface of the substrate;
   (b) removing physisorbed first reactant from the chamber to expose unfilled chemisorption sites on the surface of the substrate;
   (c) re-injecting the first reactant into the chamber, thereby chemically adsorbing a second portion of the first reactant onto the unfilled chemisorption sites on the surface of the substrate;
   (d) removing physisorbed first reactant from the chemically adsorbed first reactant;
   (e) injecting a second reactant into the chamber, thereby chemically adsorbing a first portion of the second reactant onto the surface of the substrate and forming a first portion of a monolayer solid thin film by chemical exchange;
   (f) removing physisorbed second reactant from the chemically adsorbed first reactant and the chemically adsorbed second reactant; and
   (g) re-injecting the second reactant into the chamber, thereby chemically adsorbing a second portion of the second reactant onto the surface of substrate and forming a second portion of the monolayer solid thin film by chemical exchange.

2. The method of claim 1, further comprising the step (h) of removing the physically adsorbed second reactant and residuals generated during the chemical exchange in the step (g), by purging or pumping the chamber.

3. The method of claim 2, wherein the steps (g), and (h) are sequentially repeated one or more times.

4. The method of claim 1, wherein the steps (c), and (d) are sequentially repeated one or more times.

5. The method of claim 1, wherein the time spent injecting the first reactant in step (c) is equal to or shorter than the time spent injecting the first reactant in step (a).

6. The method of claim 1, wherein the time spent injecting the second reactant in the step (g) is equal to or shorter than the time spent injecting the second reactant in step (e).

7. The method of claim 1, wherein the first and second reactants each have a structure comprising a chemical ligand and an atom for constructing the solid thin film.

8. The method of clain 1, wherein the solid thin film is comprised of a material selectcd from the group consisting of a single element, an oxide of a single element, a composite oxide, a nitride of a single element, and a composite nitride.

9. The method of claim 8, wherein the single element thin film is one selected from the group consisting of Mo, Al, Cu, Ti, Ta, Pt, Ru, Rh, Ir, W, and Ag.

10. The method of claim 8, wherein the oxide of a single element is one selected from the group consisting of $Al_2O_3$, $TiO_2$, $Ta_2O_5$, $ZrO_2$, $HfO_2$, $Nb_2O_5$, $CeO_2$, $Y_2O_3$, $SiO_2$, $In_2O_3$, $RuO_2$, and $IrO_2$.

11. The method of claim 10, wherein the refractive index of a film comprised of $Al_2O_3$ is 1.67 to 1.73 in a wavelength range of 400 to 800 nm.

12. The method of claim 8, wherein the composite oxide is one selected from the group consisting of $SrTiO_3$, $PbTiO_3$, $SrRuO_3$, $CaRuO_3$, $(Ba,Sr)TiO_3$, $Pb(Zr,Ti)O_3$, $(Pb.La)(Zr,Ti)O_3$, $(Sr,Ca)RuO_3$, $In_2O_3$ doped with Sn, $In_2O_3$ doped with Fe, and $In_2O_3$ with Zr.

13. The method of claim 8, wherein the nitride of a single element is one selected from the group consisting of SiN, NbN, ZrN, TaN, $Ya_3N_5$, AlN, GaN, WN, and BN.

14. The method of claim 8, wherein the composite nitride is one selected from the group consisting of WBN, WSiN, TiSiN, TaSiN, AlSiN, and AlTiN.

* * * * *

UNITED STATES PATENT AND TRADEMARK OFFICE
CERTIFICATE OF CORRECTION

PATENT NO. : 6,270,572 B1  
DATED : August 7, 2001  
INVENTOR(S) : Kim et al.

It is certified that error appears in the above-identified patent and that said Letters Patent is hereby corrected as shown below:

Title page,  
ABSTRACT, "purging" should read -- purging. --.

Column 1,  
Line 24, "Accordingly, so a chamber" should read -- Accordingly, a chamber --.

Column 2,  
Line 60, "thirough" should read -- through --.

Column 5,  
Line 4, "20through" should read -- 20 through --.

Column 6,  
Line 5, "from of the" should read -- from the --.  
Line 13, "which of the" should read -- which the --.  
Line 46, "fonned" should read -- formed --.

Column 7,  
Line 7, "hysisorbed" should read -- physisorbed --.  
Line 17, "thiclkess" should read -- thickness --.  
Line 24, "thiclkess" should read -- thickness --

Column 8,  
Line 42, "clain" should read -- claim --.  
Line 43, "selected" should read -- selected --.

Signed and Sealed this

Fourth Day of June, 2002

*Attest:*

*Attesting Officer*

JAMES E. ROGAN  
*Director of the United States Patent and Trademark Office*